United States Patent [19]

Sakamoto et al.

[11] Patent Number: 4,875,002
[45] Date of Patent: Oct. 17, 1989

[54] METHOD OF TESTING SEMICONDUCTOR WAFERS

[75] Inventors: Hideo Sakamoto, Tenri; Hiroshi Tsugita, Nara, both of Japan

[73] Assignee: Sharp Kabushiki Kaisha, Osaka, Japan

[21] Appl. No.: 129,895

[22] Filed: Nov. 24, 1987

Related U.S. Application Data

[63] Continuation of Ser. No. 734,346, May 15, 1985, abandoned.

[30] Foreign Application Priority Data

May 30, 1984 [JP] Japan ................................. 59-112742

[51] Int. Cl.$^4$ ....................... G01R 31/28; G06F 15/20
[52] U.S. Cl. ............................. 324/73 R; 324/73 AT; 324/158 R; 364/552
[58] Field of Search ............ 324/73 R, 73 AT, 158 R, 324/158 F, 73 PC; 371/25, 20, 15; 437/8; 364/552, 490

[56] References Cited

U.S. PATENT DOCUMENTS

| | | | |
|---|---|---|---|
| 3,751,647 | 8/1973 | Maeder et al. ........................ | 364/552 |
| 3,784,907 | 1/1974 | Eichelberger ................. | 324/73 AT |
| 3,790,767 | 2/1974 | Alexander ...................... | 324/73 AT |
| 4,074,851 | 2/1978 | Eichelberger et al. ... | 324/73 AT X |
| 4,176,780 | 12/1979 | Sacher et al. ..................... | 324/73 R |
| 4,191,996 | 3/1980 | Chesley ........................... | 324/73 AT |
| 4,335,457 | 6/1982 | Early ..................................... | 324/73 R |
| 4,430,735 | 2/1984 | Catiller ......................... | 324/73 R X |
| 4,451,970 | 6/1984 | Izu et al. ............................. | 437/8 X |
| 4,510,603 | 4/1985 | Catiller ......................... | 324/73 R X |
| 4,703,436 | 10/1987 | Varshney ............................. | 364/490 |
| 4,710,932 | 12/1987 | Hiroshi .............................. | 371/25 X |
| 4,728,883 | 3/1988 | Green ................................ | 371/25 X |

*Primary Examiner*—Reinhard J. Eisenzopf
*Assistant Examiner*—Vinh P. Nguyen
*Attorney, Agent, or Firm*—Flehr, Hohbach, Test, Albritton & Herbert

[57] ABSTRACT

Semiconductor wafers are tested more efficiently with an improved throughput. Since a plurality of test items are involved but some tests discover more defects than the others, and since neighboring wafers may be believed to have similar characteristics regarding defects, a spot-checking routine and a preferred sequence in which the plurality of tests are conducted may be selected from the data collected and stored from a preliminary testing so that defective samples are more efficiently identified.

6 Claims, 3 Drawing Sheets

METHOD OF TESTING SEMICONDUCTOR WAFERS

This is a continuation, of application Ser. No. 734,346 filed May 15, 1985, now abandoned.

This invention relates to a method of testing semiconductor wafers during a production process of semiconductor integrated circuits and more particularly to a sampling method in such testing.

The number of gates that can be carried by each chip has increased due to recent progress in semiconductor integrated circuit technologies. In order to improve the production efficiency, many kinds of tests are performed on the chips during their production processes. As chips grow larger and their patterns become more complicated, however, the cost of testing increases and the time required for such testing is becoming a serious problem because it is coming to occupy a significant portion of the total production time.

The conventional inspection processes performed during the production of semiconductor integrated circuits can be divided roughly into the following two categories, the wafer testing processes which are carried out on chips on wafers and the final testing processes which are carried out on the products in the final form after all other processes have been completed. With reference to the flow chart of semiconductor integrated circuit production processes shown in FIG. 2, wafer testing $T_1$ is carried out first when the wafer processing $P_1$ such as diffusion and wiring by etching is completed, and assembly processing $P_2$ such as packaging is effected on the "good" chips. The assembly processing $P_2$ is followed by the final testing $T_2$ to select only the good devices.

The increase in testing time generally affects both the wafer testing processes $T_1$ and the final testing processes $T_2$, but it is accepted in general that the wafer testing $T_1$ need not be stringent both because there still remain other processing steps and because the final testing $T_2$ is yet to be performed. In other words, the wafer testing is for improving the efficiency of the assembly processing by using only good chips. Thus, it need not be stringent so long as the efficiency of the assembly processing is not adversely affected. In still other words, defective chips may be included so long as the yield from the final processing is not significantly lowered. For these reasons, it has been a common procedure, in order to reduce the time needed for wafer testing, to omit a test or tests which do not detect many defects or to use a sampling method, that is, a method by spot checking regarding such tests.

Before such procedure is adopted, however, it is necessary to preliminarily determine which tests can be omitted safely, or which tests do not detect many defects. As will be explained subsequently, however, there are situations where this method of initially determining the test items to be omitted or to be done by spot checking and then omitting or using a spot checking method for such tests, fails to achieve the intended purpose.

Let us consider three kinds of tests, A, B and C, for the sake of explanation. If we assume now in the case of an ordinary wafer lot that defects are most frequently detected from the test A and least frequently from the test C as schematically illustrated in FIG. 3(a), it is naturally the test C that would be omitted or for which a method of spot checking would be employed. It sometimes happens, however, that a wafer lot with different characteristics is suddenly produced due to an accident, for example, in the wafer processing step P such that the probabilities of defects become different. Let us assume, as it can frequently happen, that defects would still be discovered most frequently from the test A in this wafer lot but that defects to be discovered by the test B would be the fewest as illustrated in FIG. 3(b). In such a situation, inflexible conventional sampling methods are likely to fail. If the test C is omitted on such a lot, the testing time will not be affected but the yield from the final testing will be adversely affected. If the test C continues to be the one for which spot checking is effected, on the other hand, the yield from the final testing will not be significantly affected but the required time for the wafer testing will become longer than if a normal testing procedure were used. FIG. 3(c) illustrates a testing result on properly processed wafers, showing low rates of occurrence of defects to be discovered by tests B and C.

Tests to be done in the wafer testing step typically include a contact testing of a pad by a probing needle, a functional test and a direct current (DC) parametric test. These tests are carried out sequentially and defective chips are separated out.

The probabilities of finding a defect by these tests vary, however, depending not only on the test but also on the position of the chip being tested within a wafer such as near the edge or near the center. According to conventional methods for testing wafers, however, the sequence in which individual tests are performed are inflexibly fixed. Let us assume, for the sake of illustration, that the aforementioned three kinds of tests are performed invariably in that sequence according to a certain wafer testing method. It then follows that the DC parametric testing is not started until the other two tests earlier in the sequence are completed, and this will be so even when the testing is done in areas where the defect to be detected by the DC parametric testing is the most likely type to occur. In other words, the efficiency of detecting defective chips is low during the initial two rounds of testing, most defects being discovered during the third round. This results in a reduced wafer throughput and hence in an increased production cost.

It is therefore an object of the present invention to provide a wafer testing method which can reduce the required time for testing without lowering the yield from the final testing step.

It is another object of the present invention to provide a wafer testing method capable or rejecting defective chips efficiently.

It is a further object of the present invention to provide a wafer testing method by which the wafer throughput can be improved.

The above and other objects of the present invention are attained by providing a wafer testing method whereby wafers or wafer lots are tested over a certain period of time and sampling is controlled on the basis of such tests. The testing efficiency can be improved by varying the sequence of tests on each chip in such a way that the test which has the highest probability of detecting a defect is performed first so that the number of testing steps can be reduced.

Figure 1:
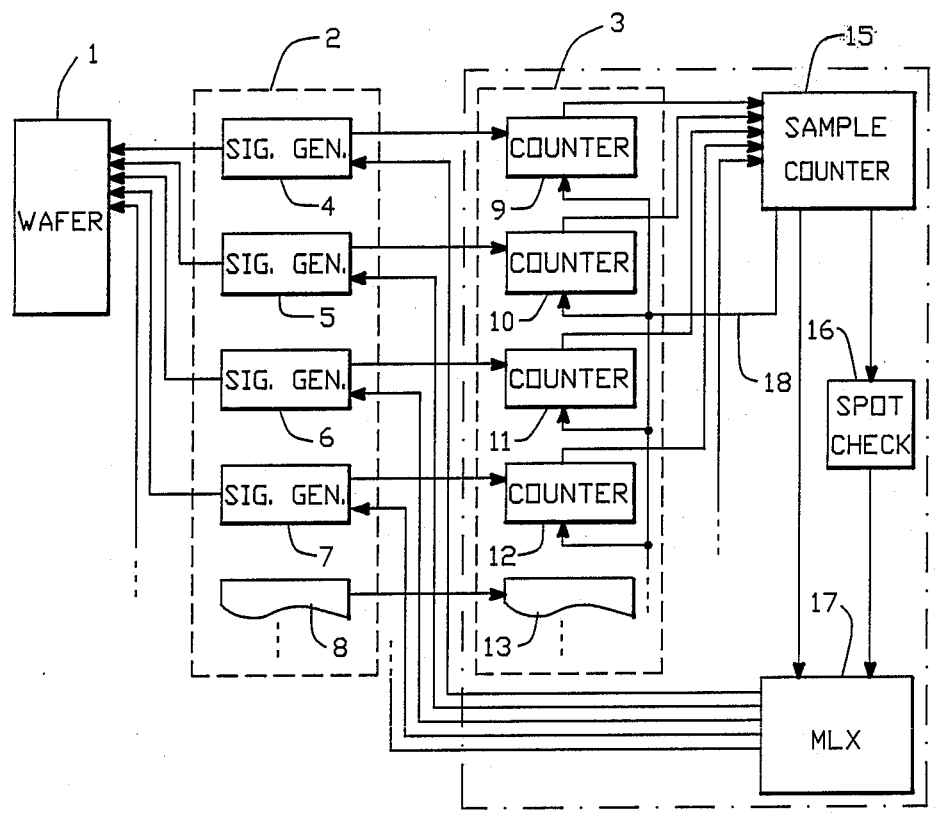
FIG. 1 is a block diagram of a portion of a wafer testing system embodying this invention.
Figure 2:
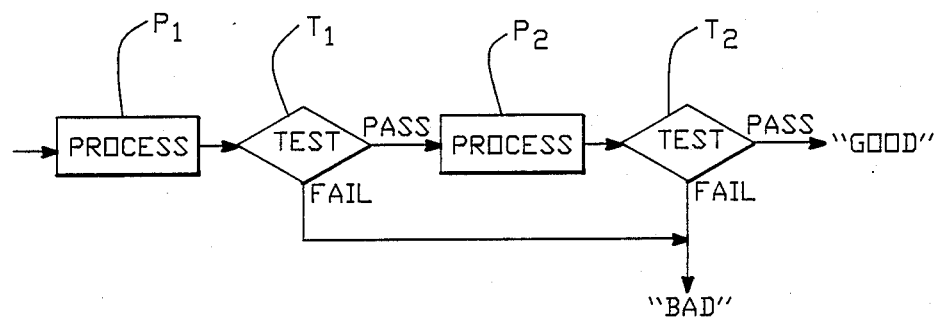
FIG. 2 is a flow chart for showing the relationship between wafer production and testing processes.
Figures 3A, 3B, 3C:
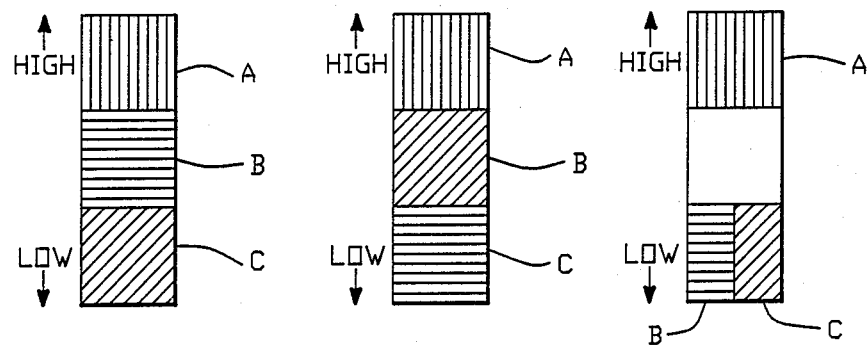
FIGS. 3a-3c show the difference in the probability of detecting defects by various tests in the wafer testing step.

There is shown in FIG. 1 an example of block diagram of a tester and its peripherals for using the sampling method of the present invention. Reference being made to this diagram, a wafer to be tested with many chips formed thereon is set at the testing position 1 of the tester 2 and tests are carried out sequentially as test signals are outputted to the chips from the test signal generators (SIG. Gen.) 4, 5, . . . in the tester 2 corresponding to different tests to be conducted.

After the tests are completed, the number of defects discovered by each test by the tester 2 is communicated through the signal generators 4, 5, . . . to be counted by the counter system 3. The counter system 3 includes counters 9, 10, . . . corresponding to the different tests. The counter system 3 operates when it is controlled by a reset signal 18 inputted to the individual counters 9, 10, . . . . In other words, when tests are done on the chips formed on a wafer, the sampling controller sample contr. 15 releases the reset signal 18 to the counters 9, 10, . . . only during the period in which sampling should be taking place and the test results are taken into and stored in the corresponding counters 9, 10, . . . .

The time period during which the aforementioned sampling is to take place is determined, depending on the number of chips on the wafer, the number of wafers in each lot, etc. If the number of chips on a wafer is large, for example, only a few characteristic points near the edge and near the center may be selected to represent a wafer. When a number of wafers are processed together as a lot, on the other hand, only a limited number of wafers may be sampled from each lot.

As described above, test results are stored in the counters 9, 10, . . . after the sampling. These results are compared and analyzed by the sampling controller 15 and the characteristics of the sampled wafer or wafer lot are recorded. Since the characteristics of wafers and wafer lots produced by identical processes are generally very alike, the results of such analysis can usually be used to predict the characteristics of the wafers or wafer lots to be tested subsequently.

In other words, if the test results show that a certain test tends to discover only a few defects, it is safe to assume that the same will be true with wafers and wafer lots to be tested subsequently. Then, the sampling controller 15 outputs a signal to activate a spot checking signal generation circuit (Spot check) 16 and a multiplexer (MLX) 17 for spot checking.

Control signals from the multiplexer 17 are inputted to the aforementioned circuits for generating test signals corresponding to the test items and give instructions whether each of these test signals should be transmitted to the wafer 1. In other words, the multiplexer 17 controls the generation of test signals and their transmission to the wafer according to the aforementioned test results so as to decide whether a spot checking method should be used for a test which discovers only a small number of defects or this test should be omitted altogether.

It should be noted that the characteristics of wafers or wafer lots are predicted by this method from a result obtained during a preliminary sampling period. It may be considered safe in most situations to omit the tests which yield very few defects but since there can be exceptional situations, it is generally preferable to use a spot checking method rather than to omit such tests altogether.

The controller 15 need not necessarily be programmed only to determine the test that discovers the largest number of defects. If it is programmed to use a spot checking method for two or more tests, the testing time can be reduced even more. In summary, this method comprises the step of performing preliminary tests on a small number of wafers or wafer lots to determine which test items are most effective so that the testing time can be reduced without lowering the yield from the final testing by carrying out only those effective test.

Figure 4:
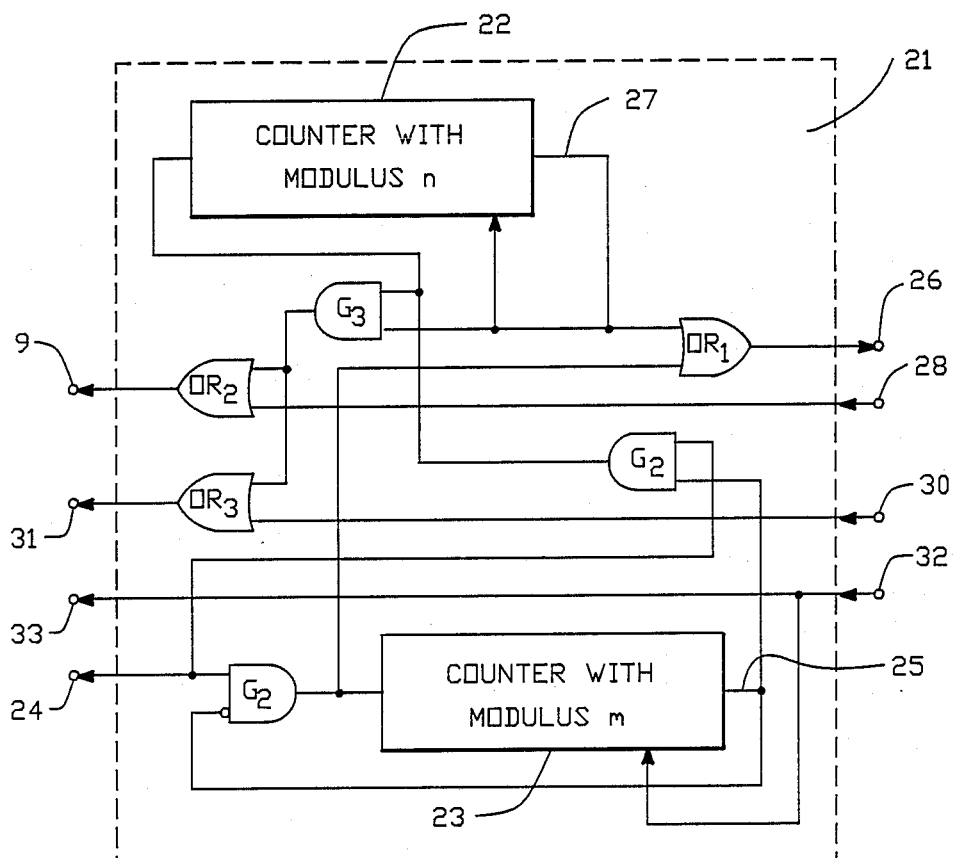
FIG. 4 is a block diagram of a circuit to be used for a spot-checking method according to the present invention.

In FIG. 4, there is shown a block diagram of a circuit 21 for outputting a spot checking signal for a spot-checking method embodying the present invention. According to an embodiment of this invention, this circuit 21 includes a counter with modulus n 22 for spot-checking every nth chip and another counter with modulus m 23 (m being preferably greater than n) for testing m successive chips when a defect is detected. A first AND gate $G_1$ is connected to the input terminal of the counter with modulus n 22. A test-requesting input signal 24 and an overflow signal 25 from the counter with modulus m 23 are applied to the input terminal of the first AND gate $G_1$. The inversion signal $\overline{25}$ of the aforementioned overflow signal 25 as well as the test-requesting input signal 24 is inputted to a second AND gate $G_2$ disposed at the input side of the counter with modulus m 23. The output from the second AND gate $G_2$ is applied to the counter with modulus m 23 and to a first OR gate OR1 to form a test-requesting output signal 26. In other words, an overflow signal 27 from the counter with modulus n 22 is also applied to the other input terminal of the first OR gate OR1 so that the test-requesting output signal 26 for spot checking is formed either by a signal which indicates an overflowing nth chip after n chips have been counted or by a signal from the second AND gate $G_2$. The aforementioned overflow signal 27 is applied to the reset terminal of the counter with modulus n 22 and resets the counter when n chips have been counted. The inversion signal $\overline{27}$ of the overflow signal 27 is applied to a third AND gate $G_3$, to the other input terminal of which is applied the output signal from the first AND gate $G_1$. The output from the third AND gate $G_3$ is applied to the input terminals of both a second OR gate OR2 and a third OR gate OR3. Inputted to the other input terminal of the second OR gate OR2 is a test-ending input signal 28 which is outputted from the tester for each test item and a test-end output signal 29 is outputted from the second OR gate OR2, indicating that the requested test has been completed.

At the end, a signal is outputted from the tester to indicate whether the test result was good or bad. A "good" input signal 30 is outputted as a "good" output signal 31 through the third OR gate OR3 while a "bad" input signal 32 is outputted as a "bad" output signal 33. This "bad" input signal 32 is also applied to the reset terminal of the counter with modulus m 23. Thus, the counter with m 23 is reset when a defective chip is detected and forms test-requesting output signals 26 successively for m chips which are subsequently sent in.

As stated above, it is preferable to use a spot-checking method rather than completely omit a test or tests which discover only a few defective samples. The frequency of spot checking (or n in the above example) is determined empirically, based on the number of chips carried on each wafer and the probability of occurrence of defects. Every time the test-requesting input signal 24 is counted n times, a test-requesting output signal 26 is formed by the overflow signal 27 from the counter with modulus n 22 through the first OR gate OR1, starting a spot-checking process. If a change in the wafer processing or wafer characteristics is detected by this sampling process, or when a "bad" input signal 32 is generated, the counter with modulus m 23 is reset and spot-checking is no longer effected on the chips that are sent in subsequently. Instead, m successive chips are tested as instructed by the test-requesting input signals 24 until the counter with modulus m 23 overflows through the second AND gate G₂ and the first OR gate OR1. The number m may be set optionally, depending on the number of chips carried on each wafer, the number of wafers in a lot, the number of good chips, etc. When the successive testing of m chips is completed, an overflow signal from the counter with modulus m 23 cuts off the second AND gate G₂ and again inputs a test-requesting signal 24 every n times to the counter with modulus n 22 through the first AND gate G₁, resuming the spot checking as before.

In summary, this method is based on the assumption that wafers in one lot and neighboring chips on one wafer are similar in characteristics. On this assumption, successive tests are conducted on chips on the same wafer or wafers in the same lot only when a defect is detected. As a result, the number of processes in the wafer testing step can be reduced, compared to the method whereby all chips or wafers are tested from the beginning. In cases of products such as integrated circuits with a high yield from the wafer testing, this method can be practical not only for a partial application regarding one or more tests which can discover only few defects but also for the entire testing including all tests.

In a still further aspect, the present invention discloses a method whereby the sequence in which the various tests in the wafer testing step can be made variable. Such a method may be referred to as a "scramble" wafer testing method.

Briefly explained, this method is for rejecting defective chips efficiently first by storing data on defects in a data memory and then by selecting a test sequence on the basis of the stored data. More in detail, chip defects associated with various test items are classified according to the locations of the individual chips on a wafer and these data are stored in the data memory. When the chips of different wafers are tested, the sequence of tests is varied in such a way, depending on the regions where the individual chips are located, that the tests which are likely to discover defects are considered first.

Figure 5:
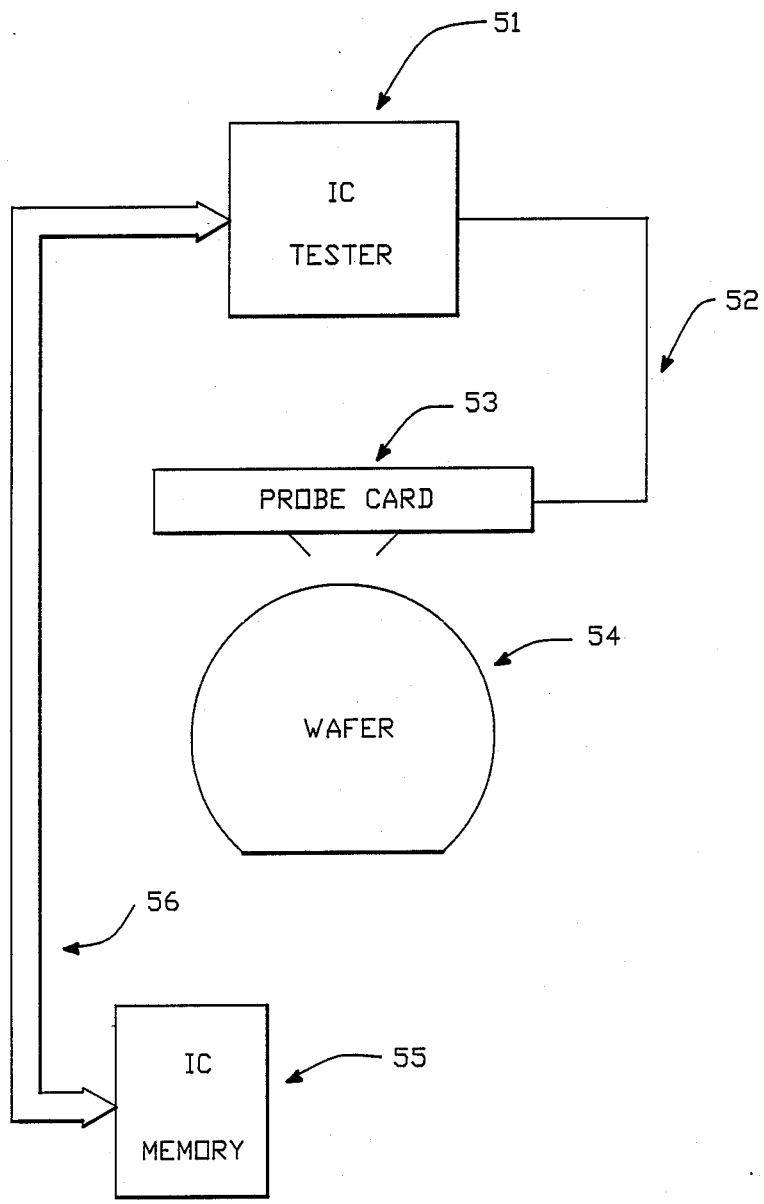
FIG. 5 is a diagram for explaining the "scramble" wafer testing method of this invention.

In FIG. 5 which shows a "scramble" wafer testing method of this invention, numeral 51 indicates an integrated circuit tester, numeral 52 indicates a cable and numeral 53 is a probe card. Numeral 54 is a wafer carrying a plurality of chips to be tested. Numeral 55 is an integrated circuit memory as a data memory and numeral 56 is a data input/output line.

At the beginning of a testing process, the first wafer is tested by using the probe card 53 and the integrated circuit tester 51 according to a predetermined (conventional) test sequence. The results of this wafer testing are recorded as data in the integrated circuit memory 55 through data input/output line 56. In this process, defective items are classified digitally according to the wafer region.

Each chip on the second and subsequent wafers is tested in the sequence varied and determined according to the data in the integrated circuit memory 55 in such a way that the test which is most likely to discover defects is given the highest priority.

Defective chips are thereby rejected quickly and efficiently. In a wafer region where defective functioning can occur most frequently, for example, a function test is conducted first in the sequence of tests on the second and subsequent wafers. When the testing moves on to another wafer region where the DC parametric defects are most likely to occur, for example, the test sequence is altered so that the DC parametric test is conducted first, followed by the test which will detect defects second most frequently.

In summary, the "scramble" wafer testing method comprises the step of changing the sequence of conducting various tests for each chip so that defective chips can be rejected efficiently. It goes without saying that changes in the test sequence have no effect on good chips.

This invention has been described above in terms of only a limited number of embodiments but many variations may be made thereon without departing from the spirit of this invention. The scope of this invention is limited only by the following claims.

What is claimed is:

1. A method of testing wafers with many chips thereon comprising the steps of
   conducting tests of a plurality of kinds on chips on said wafers during a predetermined initial period,
   counting the number of wafers which failed in each of said plurality of kinds of tests,
   storing said numbers, and
   automatically selecting one or more of said plurality of kinds of tests for subsequent testing of wafers on the basis of said stored numbers.

2. The method of claim 1 wherein said plurality of tests are conducted during said predetermined initial period in a predetermined sequence.

3. The method of claim 1 wherein said plurality of tests are conducted at specified positions of said wafers.

4. A method of testing chips on semiconductor wafers comprising the steps of
   performing a spot-checking test on every nth one of said chips, n being a preselected integer greater than 1,
   generating either a "good" or a "bad" signal according to whether the result of said test was satisfactory or not satisfactory, respectively,
   resuming said spot-checking test step if a "good" signal is generated, and
   stopping said spot-checking test step if a "bad" signal is generated and immediately thereupon testing m successive chips which follow, m being another preselected integer greater than 1.

5. The method of claim 4 wherein m is greater than n.

6. A method of testing wafers comprising the steps of obtaining data on defects discovered by a plurality of tests conducted in a sequence on chips at specified positions on a wafer, said data being classified according to said positions of said chips on said wafer, storing said data in a memory means, and causing said sequence of said plurality of tests on another chip to be changed according to said data in such a way that a test which discovers defects more frequently at the position of said another chip is conducted with high priority, whereby defective chips are injected efficiently.

* * * * *